(12) United States Patent
Narita et al.

(10) Patent No.: US 8,366,477 B2
(45) Date of Patent: Feb. 5, 2013

(54) ELECTRICAL CONNECTING APPARATUS AND CONTACTS USED THEREFOR

(75) Inventors: Satoshi Narita, Hirosaki (JP); Kenji Sasaki, Hirosaki (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 365 days.

(21) Appl. No.: 12/673,062

(22) PCT Filed: Dec. 13, 2007

(86) PCT No.: PCT/JP2007/074471
§ 371 (c)(1),
(2), (4) Date: Feb. 11, 2010

(87) PCT Pub. No.: WO2009/075041
PCT Pub. Date: Jun. 18, 2009

(65) Prior Publication Data
US 2012/0003864 A1    Jan. 5, 2012

(51) Int. Cl.
*H01R 11/18* (2006.01)
(52) U.S. Cl. ........................................................ 439/482
(58) Field of Classification Search .............. 439/482, 439/832, 862, 83; 324/755.07
See application file for complete search history.

(56) References Cited

U.S. PATENT DOCUMENTS

| | | | | |
|---|---|---|---|---|
| 4,660,920 A | * | 4/1987 | Shibano | 439/631 |
| 5,928,036 A | * | 7/1999 | Thrush | 439/631 |
| 2002/0180473 A1 | * | 12/2002 | Di Stefano | 324/762 |
| 2009/0298304 A1 | * | 12/2009 | Brunker et al. | 439/61 |

FOREIGN PATENT DOCUMENTS

| | | |
|---|---|---|
| JP | 06-294817 | 10/1994 |
| JP | 06-394817 | 10/1994 |
| JP | 06-349904 | 12/1994 |
| JP | 07-245330 | 9/1995 |
| JP | 10-050430 | 2/1998 |
| JP | 2002-286759 | 10/2002 |
| JP | 2007-107937 | 4/2007 |
| WO | WO2004/102207 A1 | 11/2004 |

* cited by examiner

*Primary Examiner* — Tulsidas C Patel
*Assistant Examiner* — Phuongchi Nguyen
(74) *Attorney, Agent, or Firm* — Ingrassia Fisher & Lorenz, P.C.

(57) ABSTRACT

An electrical connecting apparatus 10 comprises: a base plate 16 provided on its underside 14 with a plurality of pedestals 12 at intervals in a front-back direction; and multiple contact groups, each of which has a first contact 18 and a second contact 19. Each first contact 18 includes a needle body portion 24 having a rear end portion 20 supported on the pedestal 12 and a front end portion 22 which is a free end and extending leftward. Each second contact 19 includes a needle body portion 25 having a rear end portion 21 supported on the pedestal 12 and a front end portion 23 which is a free end and extending rightward. When the first contact 18 is broken, the second contacts 19 can be used.

10 Claims, 7 Drawing Sheets

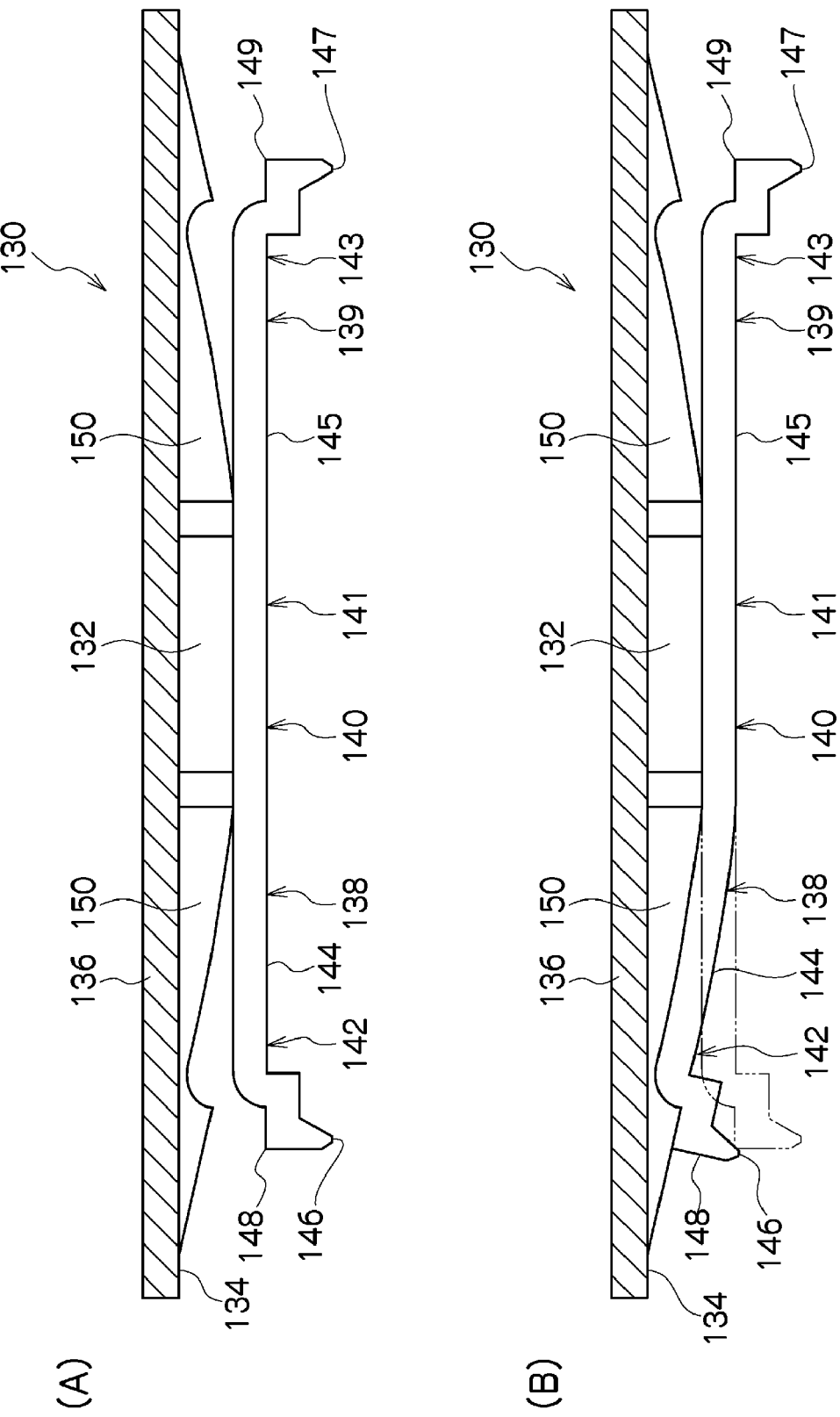

ELECTRICAL CONNECTING APPARATUS AND CONTACTS USED THEREFOR

TECHNICAL FIELD

The subject matter relates to an electrical connecting apparatus for an electrical test of an electronic device such as a semiconductor element and contacts to be used for the electrical connecting apparatus.

BACKGROUND

An electrical connecting apparatus is provided with a plurality of contacts, brings the front end (tip) of each contact into contact with an electrode of an electronic device, and passes a current through the electronic device, thereby receiving an electrical signal from the electronic device and transferring the signal to a tester connected with the apparatus to conduct a test of electrical property.

Usually, multiple contacts are arranged in the electrical connecting apparatus in one or more rows to correspond to the arrangement of the electrodes of the electronic device to be tested.

In such a row or rows of the contacts, when one contact becomes unusable or unsuitable for use due to breakage, wear or the like, even if the other contacts of the same row is sufficiently usable, it becomes impossible to test of the electronic device by using the row. If there are many unusable contacts, it can be taken into consideration to replace the electrical connecting apparatus itself, but if there are only a few, it is economical to replace only such contacts.

In Patent Documents 1-3 are described such methods of replacing unusable contacts.

The method of replacing as described in Patent Document 1 is carried out in such a manner as, after cutting and removing a probe which became unusable, a replaceable probe is newly attached to a fixing region set on the electric wiring of a wiring board.

According to this method of replacing, however, the narrower a pitch between the probes is, the harder the replacing work becomes.

The replacing method according to Patent Document 2 is carried out by forming a block (probe card sub-base plate at each of the probes) and replacing the block to which the unusable probes belong.

There is a problem in this method, however, that a work for adjusting a pitch between a newly replaced block and the other blocks is necessitated, which is troublesome and inconvenient. In addition, there is another problem that it also takes time and labor in positioning to remount a probe card which had been dismounted from a probe card assembling apparatus for the replacement work.

The replacing method described in Patent Document 3 is carried out by replacing a needle having bad conductivity with a spare needle.

This replacing method, however, is meant to be applied to an integrated circuit chip to be tested which is provided with spare electrodes, so that it is not suitable for ordinary integrated circuit chips which have no spare electrodes.

Further, as a prior art of an electrical connecting apparatus provided with contacts and their spare contacts, Patent Document 4 describes one which uses a spare probe when a probe becomes unusable. The probe card described in Patent Document 4 comprises probes and spare probes juxtaposed thereto.

However, since the spare probes of this probe card is juxtaposed to the probes which become unusable and arranged in the same probe rows, if a pitch between the probes and the spare probes is narrow, it is difficult to use the spare probe alternatively for the probe which became unusable.

Patent Document 1: JP Patent Appln. Public Disclosure No. 2007-107937
Patent Document 2: JP Patent Appln. Public Disclosure No. 6-349904
Patent Document 3: JP Patent Appln. Public Disclosure No. 7-245330
Patent Document 4: JP Patent Appln. Public Disclosure No. 6-294817

SUMMARY

An electrical connecting apparatus is provided by which, when one of the contacts of the electrical connecting apparatus is bent or broken and becomes no longer usable, the other contact corresponding thereto can be used to lengthen a replacement cycle of the electrical connecting apparatus.

Another connecting apparatus is provided by which, when one of the contacts of the electrical connecting apparatus is bent or broken and becomes no longer usable, the other contact corresponding thereto can be used to lengthen a replacement cycle of the contacts.

The electrical connecting apparatus comprises: a base plate provided with an underside and a plurality of connecting portions arranged on the underside at intervals in the front-back direction; and multiple contact groups each of which has a pair of contacts, and each contact includes a needle body portion having one end portion supported at the connecting portion and the other end which is a free end extending in the right-left direction.

The needle body portion of one of the contacts in each contact group extends from the connecting portion to one side in the right-left direction, and the needle body portion of the other contact in each contact group extends from the connecting portion to the other side in the right-left direction.

Each contact can further includes a tip portion directed downward from the other end portion. Also, the tip portion has a tip at its lower end, and the tip of the one contact may be positioned lower than the tip of the other contact.

The one and the other contacts may be formed integrally. The needle body portion of the one contact and the needle body portion of the other contact may be supported at a common connecting portion. The needle body portion of the one contact can be made longer than the needle body portion of the other contact. Each contact can be made of a flexible electrically conductive material. Each contact includes a plurality of stoppers positioned above it and arranged on the underside of the base plate, and each stopper has an underside adapted to the upside of each contact.

The contact used for the electrical connecting apparatus in some embodiments has a main body portion with both end portions and a tip portion extending from each of both end portions downward in the vertical direction.

Since the electrical connecting apparatus according to an embodiment comprises multiple contact groups each having a pair of contacts, if one of the contacts of one of the groups becomes unusable, all of the others of the contacts of all the groups can be used, thereby lengthening a replacement cycle of the electrical connecting apparatus on account of occurrence of an unusable contact.

In addition, each of the contacts used in the electrical connecting apparatus according to an embodiment being provided with the tip portion extending from each of both ends of the needle body portion downward in the vertical direction, so that even if one of the tip portions becomes unusable due to bending or breakage, the tip of the other tip portion can be used, thereby lengthening a replacement cycle of the contacts on account of occurrence of an unusable contact.

BRIEF DESCRIPTION OF THE DRAWINGS

FIG. 7(A) is a schematic section of a fifth embodiment of the electrical connecting apparatus; and FIG. 7(B) is a schematic section of the electrical connecting apparatus in a state where the first contacts are brought into contact with the electrodes of the electronic device.

DETAILED DESCRIPTION

In the following are explained preferable embodiments with reference to the drawings.

Explanation of Terms

In the embodiments, the front-back direction is a direction orthogonal to a longitudinal axial direction of the contact and also parallel to the sheet surface; right-left direction is longitudinal axial direction of the contact; and the up-down direction is a vertical direction relative to the sheet surface. These directions, however, differ depending on an attitude of an electronic device, which is a device under test, at the time of disposing the device in a test apparatus for attaching the electrical connecting apparatus.

Embodiment 1

Figure 1:
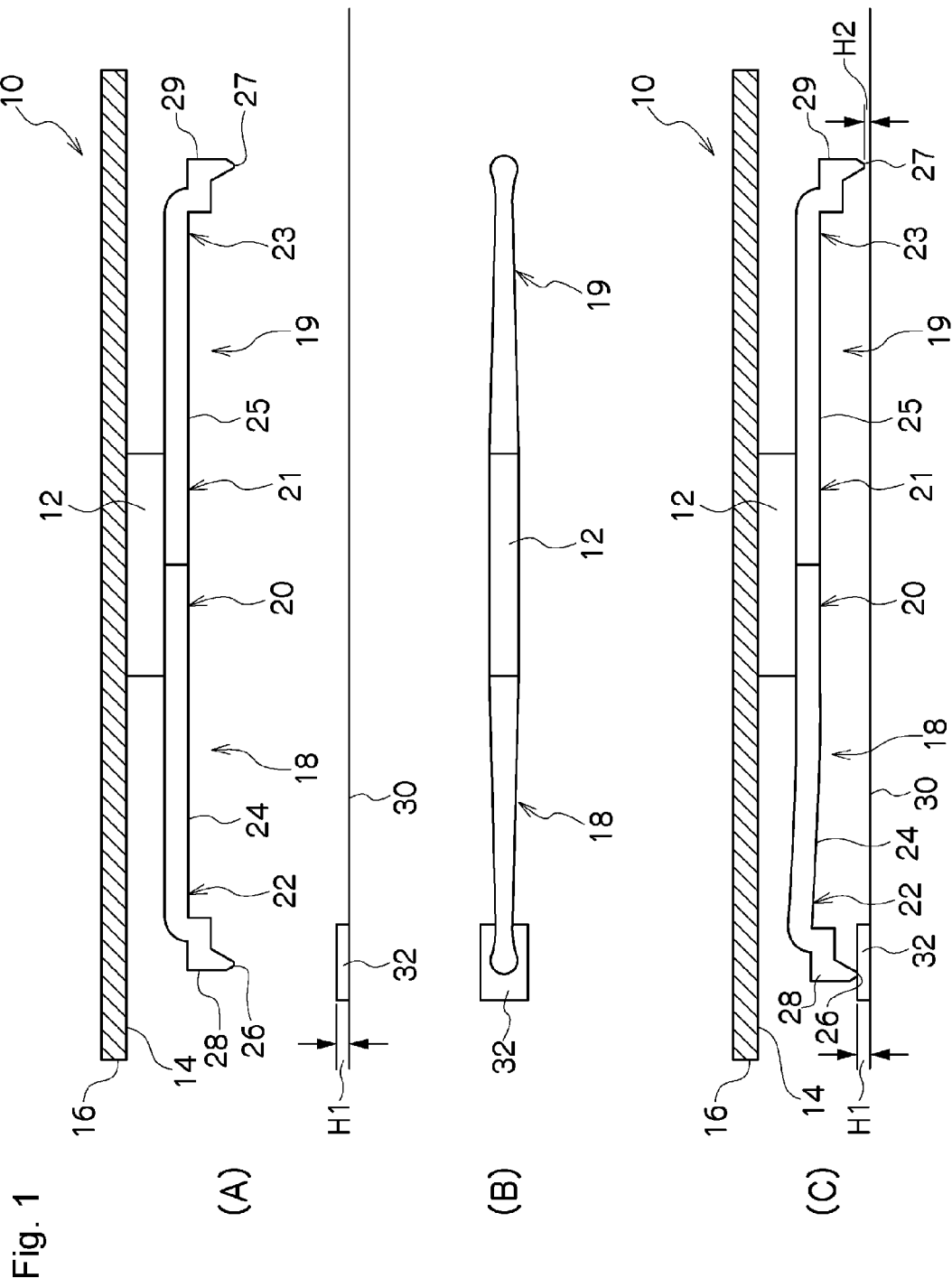
FIG. 1(A) is a schematic section showing a first embodiment of the electrical connecting apparatus together with electrodes of an electronic device.
FIG. 1(B) is a view seeing the first and second contacts in FIG. 1(A) from above.
FIG. 1(C) shows a state where the tips are brought into contact with the electrodes by raising the electronic device in FIG. 1(A) vertically.
Figure 2:
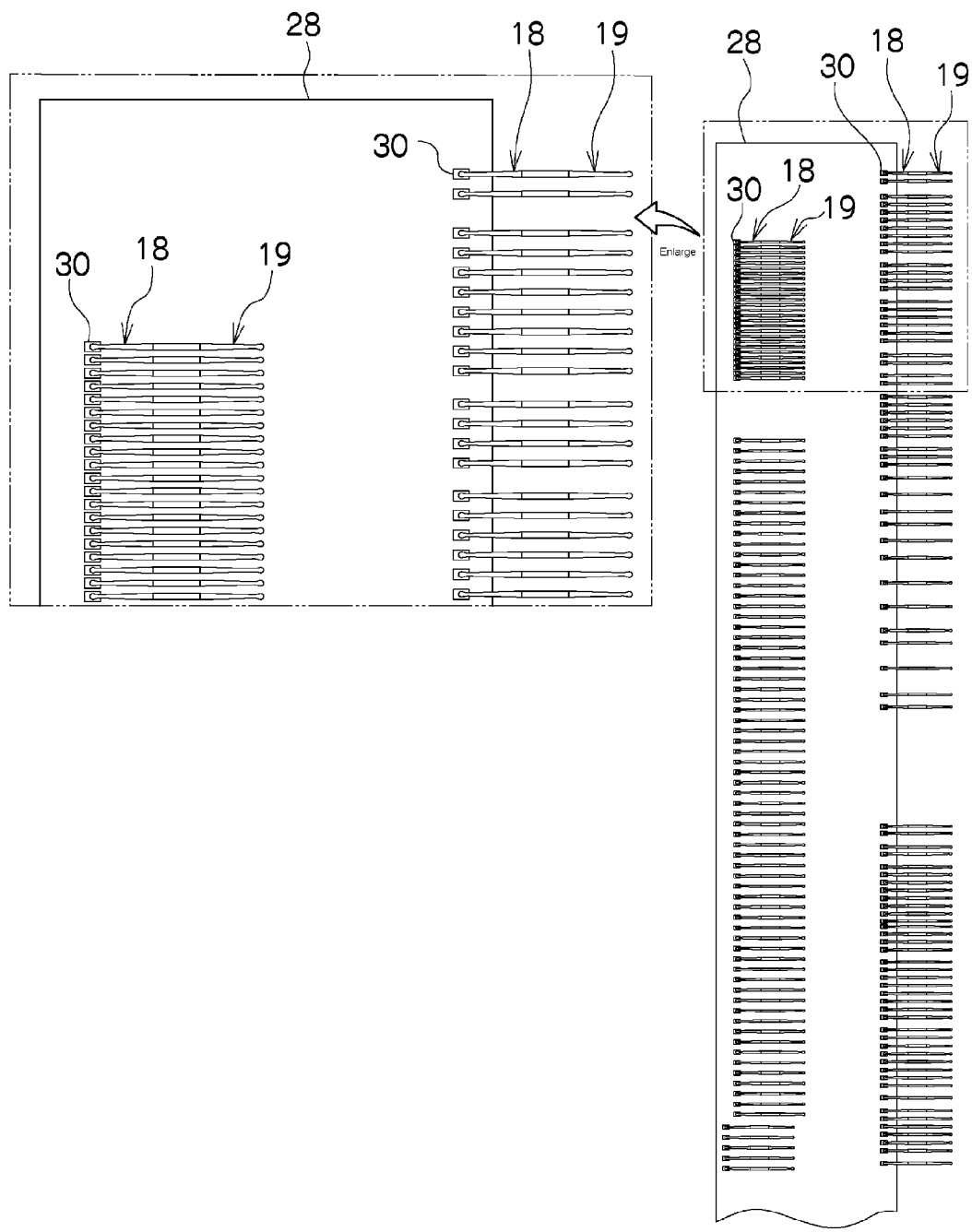
FIG. 2 is a view showing a state where a plurality of the first contacts are in contact with a plurality of electrodes of the electronic device in one-to-one correspondence, together with a partially enlarged view.
Figure 3:
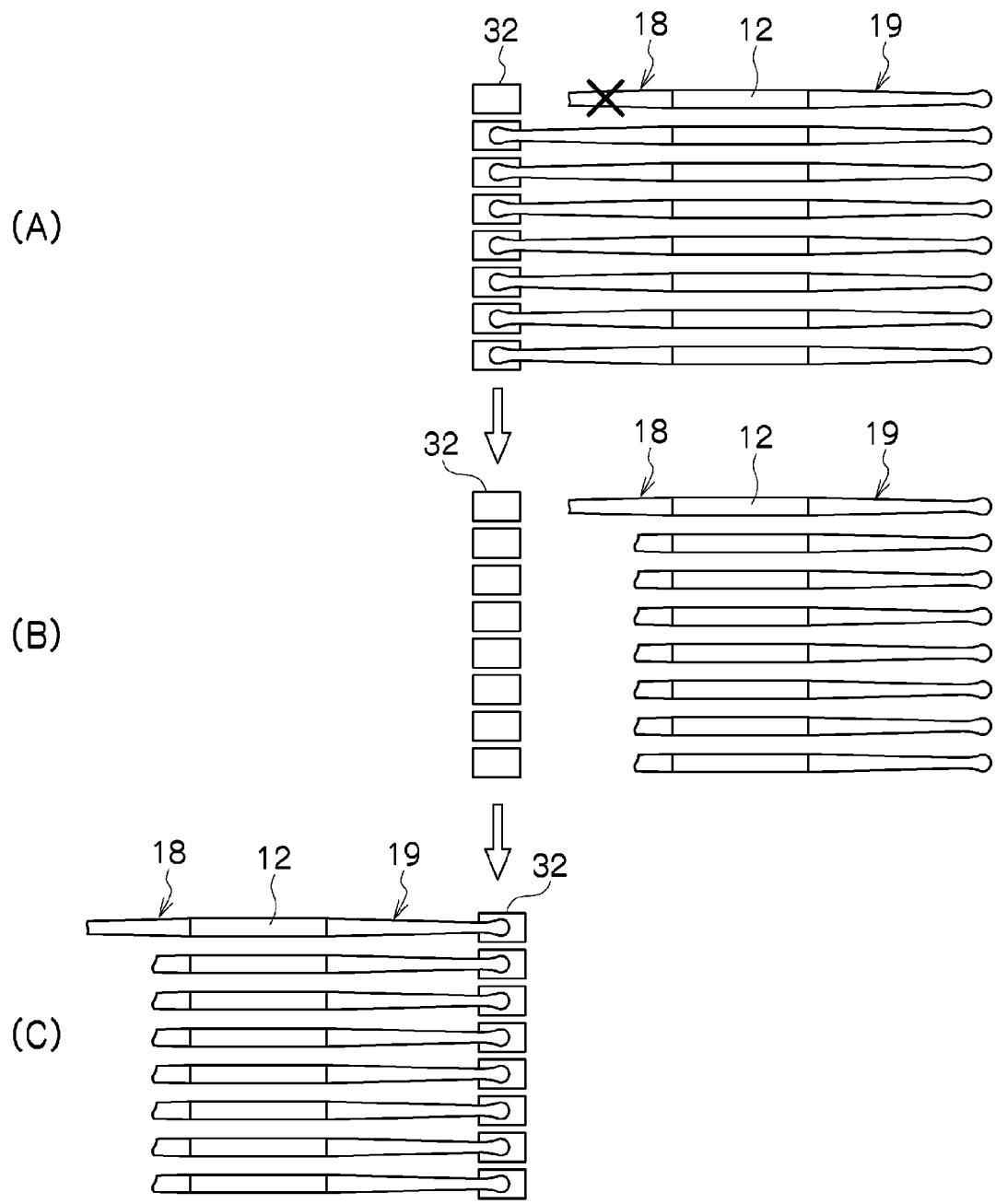
FIGS. 3(A) through (C) are schematic views explaining a change from a state of using the first contacts to a state of using the second contacts.

With reference to FIGS. 1-3, embodiment 1 of the electrical connecting apparatus will be explained.

Referring to FIG. 1(A), the electrical connecting apparatus is shown by a schematic section together with an electrode of an electronic device.

The electrical connecting apparatus 10 according to this embodiment comprises a disk-shaped base plate 16 having a plurality of pedestals 12 (only one is shown in FIG. 1(A)) at intervals in the front-back direction on the underside 14, and multiple contact groups (FIG. 2) each having a pair of a first contact 18 and a second contact 19.

The first contacts 18 and the second contacts 19 have an identical shape and an identical length and are made of a flexible electrically conductive metal material such as tungsten, nickel or the like.

Each first contact 18 includes a needle body portion 24 which has a rear end portion (one end portion) 20 and a front end portion (the other end portion) 22. The needle body portion 24 extends leftward from the pedestal 12 and approximately in parallel to the base plate 16.

Each second contact 19 includes a needle body portion 25 which has a rear end portion (one end portion) 21 supported on the pedestal 12 and a front end portion (the other end portion) 23. The needle body portion 25 extends rightward from the pedestal 12 and approximately in parallel to the base plate 16.

Thus, as shown, each first contact 18 is cantilevered at the rear end portion 20 so as to be positioned on the left side from the pedestal 12. Also, each second contact 19 is cantilevered so as to be positioned on the right side from the pedestal 12.

The front end portion 22 of each needle body portion 24 includes a tip portion 28 having a tip 26 at its front end. Each needle body portion 25 includes a tip portion 29 having a tip 27 at its front end. The rear end of each needle body portion 24 is connected to the rear end of the needle body portion 25.

Vertically downward of the tips 26 are electrode pads 32 of an electronic device 30. When passing electric current through the electronic device 30, the electronic device 30 rises vertically, and the electrode pads 32 contact the tips 26. Then, an electrical signal inputted to the electrical connecting apparatus 10 through the tip 26 is fed to a tester (not shown) connected to the electrical connecting apparatus 10 and is tested an electrical property. The tips 26 and the tips 27 have the identical shape.

The base plate 16 includes an FPC (flexible printed circuit) (not shown), and the contacts 18, 19 are connected to the FPC through the wiring within the corresponding common pedestal 12. Each pedestal 12 is, for example, made of an insulating material and arranged so as to contact both contacts 18, 19. Incidentally, the pedestal, if made of a metal material, can be integrated with the contacts 18, 19. Also, the pedestal acts as a so-called connecting portion.

FIG. 1(B) is a view of the first and second contacts 18, 19 connected to the pedestal 12 seen from above in a state where the base plate 16 in FIG. 1(A) is removed.

FIG. 1(C) shows a state where the tips 26 are brought into contact with the electrode pads 32 by vertically raising the electronic device 30 by a moving apparatus (not shown). As shown in this view, each first contact 18 becomes an upwardly warped state (overdrive state), and as each tip 26 scrapes off an oxide film on the surface of each electrode pad 32, an electrical contact is established between each tip 26 and each electrode pad 32. On the other hand, each second contact 19 is held at a height H2 where it does not contact the electronic device 30.

FIG. 2 shows a state where a plurality of the first contacts 18 are in contact with a plurality of the electrode pads 32 of the electronic device 30 in one-to-one correspondence together with its partially enlarged view.

FIGS. 3(A)-(C) are conceptual diagrams explaining a change (work for replacing contacts) from a state of using the first contacts 18 to a state of using the second contacts 19.

As shown in FIG. 3(A), the electronic device 30 is provided with a row of electrode pads 32 arranged at intervals in the front-back direction, and each contact 18 is brought into contact with the corresponding electrode pad 32.

When one contact is broken around its center (a state as shown by "X" in FIG. 3(A)), the electronic device 30 is lowered, and each contact 18 is made contactless with the corresponding electrode pad 32. Thereafter, all the other contacts 18 are cut by bending at positions close to their rear end portions 20 (FIG. 3(B)) by means of a tool such as a pair of tweezers. Then, the electronic device 30 is moved rightward by a moving apparatus (not shown) to position the electrode pads 32 vertically below the tips 27 of the second contacts 19, the electronic device 30 is again vertically raised to bring the tips 26 into contact with the electrode pads 32 (FIG. 3(C)). Because of these series of actions, even if one contact 18 is broken, replacement and restoration of contacts can be easily made by substituting the second contacts 19.

As shown in FIG. 3(B), since the tip portions 28 of all the other contacts 18 are removed, the tips 26 can be prevented from accidentally contacting the neighboring electrode pads 32.

Embodiment 2

Figure 4:
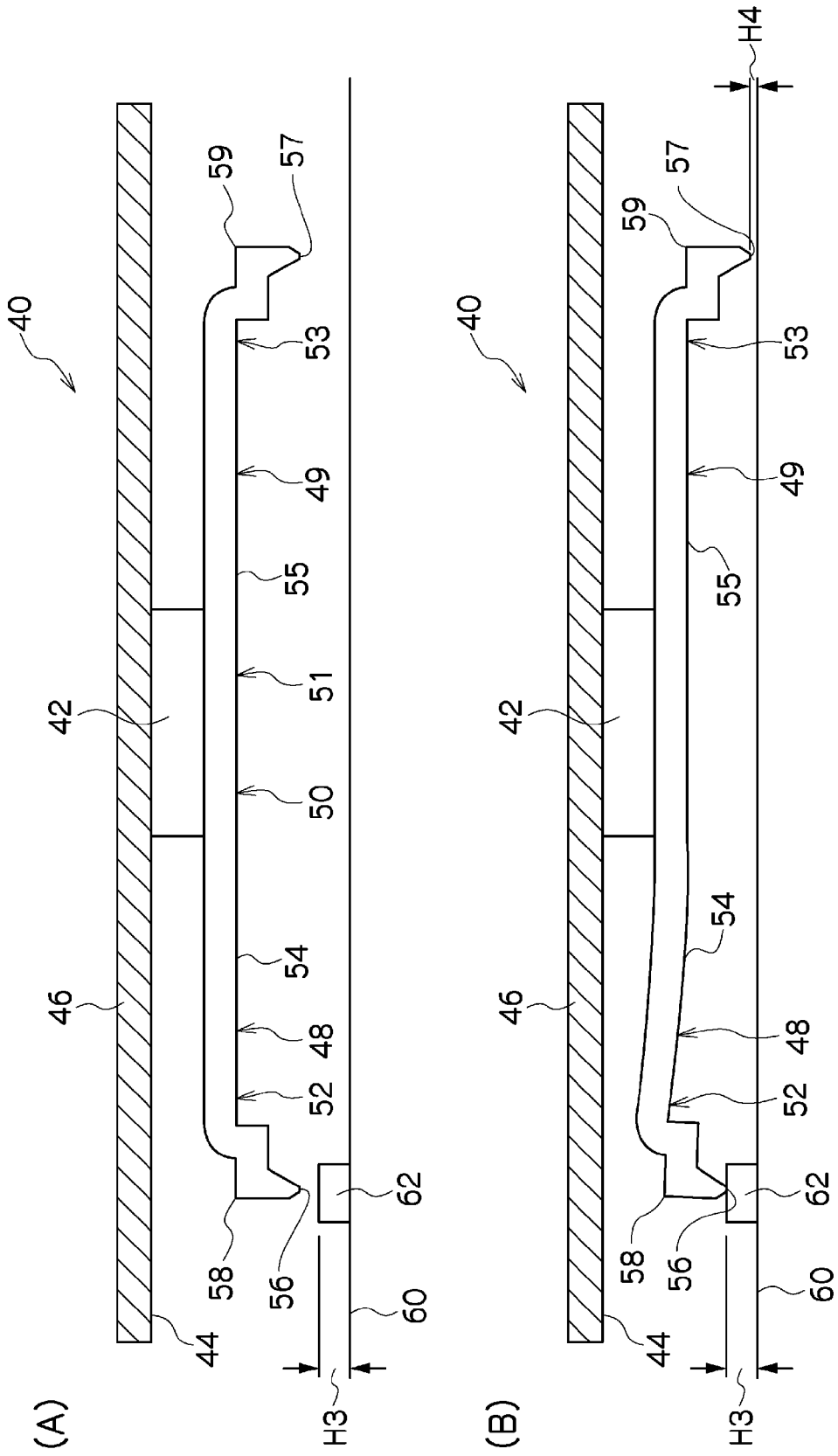
FIG. 4(A) is a schematic section showing a second embodiment of the electrical connecting apparatus together with the electrodes of the electronic device to be tested.
FIG. 4(B) shows a state where the tips are brought into contact with the electrodes by raising the electronic device in FIG. 4(A) vertically.

Embodiment 2 of the electrical connecting apparatus according to another embodiment is explained with reference to FIG. 4.

FIG. 4(A) is a schematic section showing the electrical connecting apparatus together with the electrodes of the electronic device.

The electrical connecting apparatus 40 according to the embodiment comprises: a disk-shaped base plate 46 having a plurality of pedestals (connecting portions) 42 (FIG. 4(A) shows only one of them) on the underside 44; and multiple contact groups (equivalent to the contact groups of the first contacts 18 and the second contacts 19 in FIG. 2) each having a pair of a first contact 48 and a second contact 49.

The first contacts 48 and the second contacts 49 have an identical shape and an identical length, and are made of a flexible electrically conducting metal material such as tungsten, nickel or the like.

Each first contact 48 has a needle body portion 54 including a rear end portion (one end portion) 50 and a front end portion (the other end portion) 52 which is a free end. The needle body portion 54 extends leftward from the pedestal 42 approximately in parallel to the base plate 46.

Each second contact 49 has a needle body portion 55 including a rear end portion (one end portion) 51 supported on the pedestal 42 and a front end portion (the other end portion) 53 which is a free end. The needle body portion 55 extends rightward from the pedestal 42 approximately in parallel to the base plate 46.

In this embodiment, the first contact 48 and the second contact 49 are integrally formed, and the pedestal 42 is disposed substantially at the central portion of the first contact 48 and the second contact 49. Thus, the lengths of the needle body portion 54 of the first contact 48 and the needle body portion 55 of the second contact 49 are equal.

Accordingly, as illustrated, each first contact 48 is cantilevered at the rear end portion 50 so as to be positioned on the left side from the pedestal 42. And each second contact 49 is cantilevered at the rear end portion 51 so as to be positioned on the right side from the pedestal 42.

The front end portion 52 of each needle body portion 54 has a tip portion 58 including a tip 56 at its front end. Each needle body portion 55 has a tip portion 59 including a tip 57 at its front end. The rear end of each needle body portion 54 is connected integrally with the rear end of the needle body portion 55.

Vertically below the tips 56 are electrode pads 62 of an electronic device 60. When passing electric current through the electronic device 60, the electronic device 60 rises vertically, and the electrode pads 62 contact the tips 56. At this time, an electrical signal inputted through the tip 56 to the electrical connecting apparatus 40 is fed to a tester (not shown) connected to the electrical connecting apparatus 40, to test electrical properties. The tips 56 and the tips 57 have the same configuration.

The base plate 46 has an FPC (flexible print circuit) (not shown), and the contacts 48, 49 are connected to the FPC through the wiring within the corresponding common pedestal 42. Each pedestal 42 is made of, for example, an insulating material and is disposed so as to be connected to both contacts 48, 49. Incidentally, if the pedestal of a metal material is made of a metal material, the contacts 48, 49 and the pedestal 42 may be made integrally. Also, the pedestal 42 acts as a what is called connecting portion.

The electronic device 60 used in this embodiment has a plurality of bump electrodes 62, each of which has a height H3 (FIG. 4(A)) higher than the height H1 (FIG. 1(A)) of the electrode pads 32 of the electronic device 30.

FIG. 4(B) shows a state where the tips 56 are brought into contact with the electrodes 62 by vertically raising the electronic device 60 in FIG. 4(A) by a moving apparatus (not shown). As shown in FIG. 4(B), the first contacts 48 are warped upward (overdrive state) and each tip 56 scrapes off an oxide film on the surface of each bump electrode 62, thereby establishing an electrical connection between each tip 56 and each bump electrode 62. On the other hand, each second contact 49 is held at a height H4 at which the second contact 49 does not contact the electronic device 60.

Also, in the electrical connecting apparatus 40, as explained in FIGS. 3(A)-(C), a change (exchanging operation of contacts) from a state of using the first contacts 48 to a state of using the second contacts 49 is made.

Embodiment 3

Figure 5:
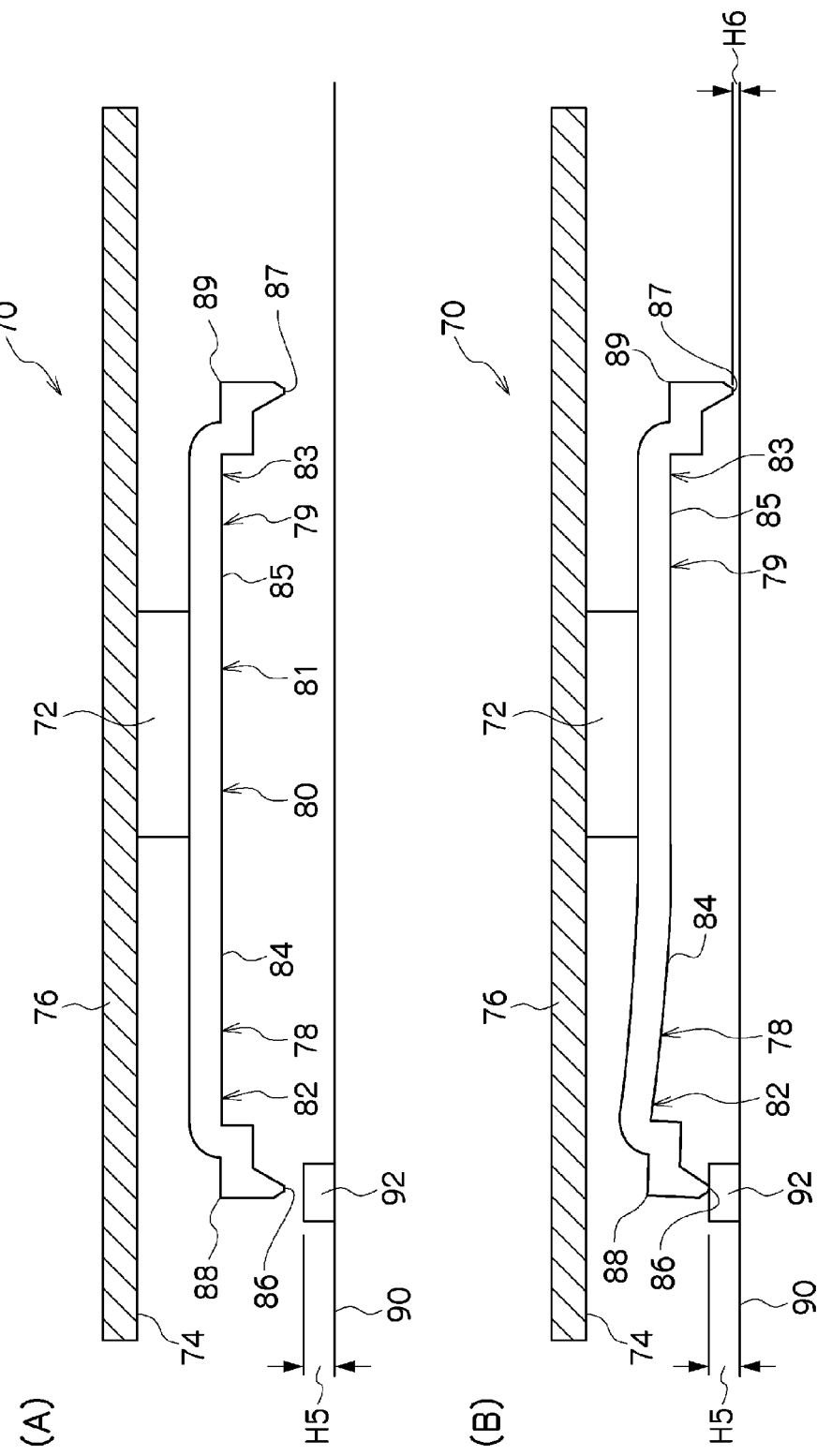
FIG. 5(A) is a schematic section showing a third embodiment of the electrical connecting apparatus together with the electrodes of the electronic device to be tested.
FIG. 5(B) shows a state where the second contacts are brought into contact with the electrodes by vertically raising the electronic device in FIG. 5(A).

Embodiment 3 of the electrical connecting apparatus according to another embodiment will be explained with reference to FIG. 5.

FIG. 5(A) is a schematic section in which the electrical connecting apparatus is shown together with the electrode of the electronic device to be tested.

The electrical connecting apparatus 70 according to this embodiment comprises: a disk-shaped base plate 76 having a plurality of pedestals (connecting portions) 72 (only one is shown in FIG. 5(A)) at intervals in the front-back direction on the underside 74; and multiple contact groups, (equivalent to the contact groups of the first contacts 18 and the second contacts 19 in FIG. 2) each including a pair of a first contact 78 and a second contact 79.

The first contacts 78 and the second contacts 79 are made of a flexible electrically conductive metal material such as tungsten, nickel or the like.

Each first contact 78 includes a needle body portion 84 having a rear end portion (one end portion) 80 supported on the pedestal 72 and a front end portion (the other end portion) 82 which is a free end. The needle body portion 84 extends leftward from the pedestal 72 approximately in parallel to the base plate 76.

Each second contact 79 includes a needle body portion 85 which has a rear end portion (one end portion) 81 supported on the pedestal 72 and a front end portion (the other end portion) 83. The needle body portion 85 extends rightward from the pedestal 72 approximately in parallel to the base plate 76

The pedestal 72 is disposed rather closer to the front end portion 83 from the central portion of the first and second contacts 78, 79. Therefore, the length of the needle body portion 84 of each first contact 78 is longer than that of the needle body portion 85 of each second contact 79.

Accordingly, as illustrated, each first contact 78 is cantilevered at the rear end portion 80 so as to be positioned on the left side from the pedestal 72. In addition, each second contact 79 is cantilevered at the rear end portion 81 so as to be positioned on the right side from the pedestal 72.

The front end portion 82 of each needle body portion 84 includes a tip portion 88 having a tip 86 at its front end. Each needle body portion 85 includes a tip portion 89 having a tip 87 at its front end. The rear end of each needle body portion 84 is connected integrally to the rear end of the needle body portion 85.

There are electrode pads 92 of the electronic device 90 vertically below the tips 86. When conducting a test of passing electric current, the electronic device 90 rises vertically by a moving apparatus (not shown), and the electrode pads 92 come into contact with the tips 86. At this time, an electrical signal inputted to the electrical connecting apparatus 70 through the tip 86 is fed to a tester (not shown) connected to the electrical connecting apparatus 70 to test electrical properties. The tips 86 and the tips 87 have an identical configuration.

The base plate 76 includes an FPC (flexible print circuit) (not shown), and the contacts 78, 79 are connected to the FPC through the wiring within the common pedestal 72. Each pedestal 72 is made of, for example, an electrically insulating material and is disposed so as to contact both contacts 78 and 79. Incidentally, if the pedestal 72 is made of a metal material, the contacts 78, 79 and the pedestal 72 may be made integrally. Also, the pedestal 72 acts as what is called the connecting portion.

The electronic device 90 used in this embodiment has a plurality of bump electrodes 92, each of which has a height H5 (FIG. 5(A)) higher than the height H1 (FIG. 1(A)) of the electrode pad 32 of the electronic device 30.

FIG. 5(B) shows a state where the tips 86 are brought into contact with the electrodes 92 by vertically raising the electronic device 90 by a moving apparatus (not shown). As shown in Fig. 5(B), when each first contact 78 is warped upward and each tip 86 scrapes off the oxide film on the surface of each bump electrode 92, electrical connections are established between the tips 86 and the bump electrodes 92. On the other hand, each second contact 79 is held at a height H6 where the second contact 79 does not contact the electronic device 90.

Also, in the electrical connecting apparatus 70, as explained in FIGS. 3(A)-(C), a change from a state of using the first contacts 78 to a state of using the second contacts 79 (exchange operation of contacts) is made.

Embodiment 4

Figure 6:
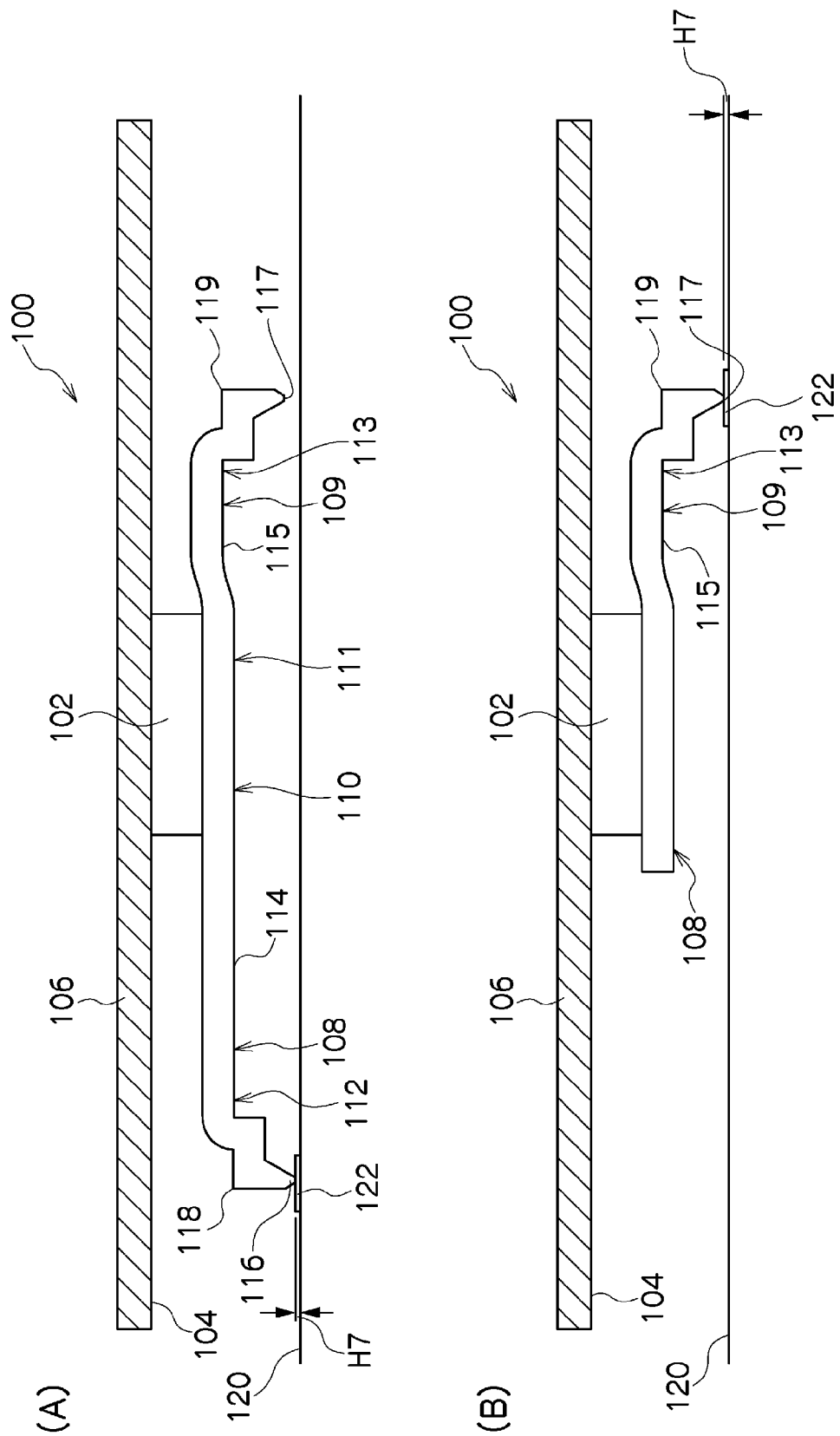
FIG. 6(A) is a schematic section showing a fourth embodiment of the electrical connecting apparatus together with the electrodes of the electronic device to be tested.
FIG. 6(B) is a schematic section of the electrical connecting apparatus in a state where the second contacts are brought into contact with the electrodes of the electronic device.

Embodiment 4 of the electrical connecting apparatus according to another embodiment is explained with reference to FIG. 6.

FIG. 6(A) is a schematic section in which the electrical connecting apparatus is shown together with the electrode of the electronic device.

An electrical connecting apparatus 100 according to this embodiment comprises: a disk-shaped base plate 106 including a plurality of pedestals (connecting portions) 102 (only one is shown in FIG. 6(A)) at intervals in the front-back direction on the underside 104; and multiple contact groups (equivalent to the contact groups of the first contacts 18 and the second contacts 19 in FIG. 2) each group including a pair of a first contact 108 and a second contact 109.

The first contacts 108 and the second contacts 109 are made of a flexible electrically conductive metal material such as tungsten, nickel or the like.

Each first contact 108 includes a needle body portion 114 having a rear end portion (one end portion) supported on the pedestal 102 and a front end portion (the other end portion) which is a free end. The needle body portion 114 extends leftward from the pedestal 102 approximately in parallel to the base plate 106.

Each second contact 109 includes a needle body portion 115 having a rear end portion (one end portion) 111 supported on the pedestal 102 and a front end portion (the other end portion) 113 which is a free end. The needle body portion 115 extends rightward from the pedestal 102 approximately in parallel to the base plate 106.

The pedestal 102 is disposed rather closer to the front end portion 113 from the central portion of the first contact 108 and the second contact 109. Therefore, the length of the needle body portion 114 of each first contact 108 is longer than that of the needle body portion 115 of each second contact 109.

Thus, as illustrated, each first contact 108 is cantilevered at the rear end portion 110 so as to be positioned on the left side from the pedestal 102. Also, each second contact 109 is cantilevered at the rear end portion 111 so as to be positioned on the right side from the pedestal 102.

The front end portion 112 of each needle body portion 114 includes a tip portion 118 having a tip 116 at its front end. Each needle body portion 115 has a tip portion 119 having a tip 117 at its front end. The rear end of each needle body portion 114 is connected integrally to the rear end of the needle body portion 115.

There are electrode pads 122 of an electronic device 120 vertically below the tips 116. When conducting a test of passing electric current through the electronic device 120, the electronic device 120 rises vertically by a moving apparatus (not shown) and brought into contact with the tips 116. At this time, an electrical signal inputted to the electrical connecting apparatus 100 through the tip 116 is fed to a tester (not shown) connected to the electrical connecting apparatus 100 to test electrical properties. The tips 116 and 117 have an identical configuration.

The base plate 106 includes an FPC (flexible print circuit) (not shown), and the contacts 108, 109 are connected to the FPC through the wiring within the corresponding common pedestal 102. Each pedestal 102 is made of, for example, an electrically insulating material and disposed so as to contact both contacts 108, 109. Incidentally, if the pedestal is made of a metal material, the contacts 108, 109 and the pedestal 102 may be made integrally. Also, the pedestal 102 acts as what is called the connecting portion.

The electronic device 120 used in this embodiment has a plurality of bump electrodes 122 each of which has a height H7 (FIG. 6(A)) lower than the height H1 (FIG. 1(A)) of the electrode pad 32 of the electronic device 30.

Though not shown, by slightly raising the electronic device 120 vertically by a moving apparatus (not shown), each first contact 108 is warped upward (overdrive state), and each tip 116 scrapes off the oxide film on the surface of each bump electrode 122, whereby an electrical connection is established between each tip 116 and each bump electrode 122. On the other hand, each second contact 109 is held at a height where the second contact 109 is not brought into contact with the electronic device 120.

Each needle body portion 114 is bent slightly upward near the end portion on the side of the second contact 109 of the pedestal portion 102, each second contact 109 being supported at a higher position than each first contact 108. Thus, even if the electrode pads 122 are very thin or disposed flush with the electronic device 120, the tip 117 of each second contact 109 is held at a height where it does not contact the electronic device 120.

FIG. 6(B) shows a schematic section of the electrical connecting apparatus 100 in a state where, after removing the first contacts 108 in an exchanging work of contacts, the second contact 109 corresponding to each first contact 108 is brought into contact with the electrode pad 122 of the electronic device 120.

In the electrical connecting apparatus 100 as well, as explained in FIG. 3(A)-(C), a change (exchange work of contacts) from a state of using the first contacts 108 to a state of using the second contacts 109 is made.

Embodiment 5

Embodiment 5 of the electrical connecting apparatus according to another embodiment is explained with reference to FIG. 7.

FIG. 7(A) is a schematic section of the electrical connecting apparatus.

The electrical connecting apparatus 130 according to this embodiment comprises: a disk-shaped base plate 136 with a plurality of pedestals (connecting portions) 132 (in FIG. 7(A) only one is shown) at intervals in the front-back direction on the underside 134; and multiple contact groups (equivalent to the contact groups of the first contacts 18 and the second contacts 19 in FIG. 2), each having a pair of the first contacts 138 and the second contacts 139.

The first contacts 138 and the second contacts 139 are made of a flexible electrically conductive metal material such as tungsten, nickel or the like.

Each first contact 138 includes a needle body portion 144 having a rear end portion (one end portion) 140 supported on the pedestal 132 and a front end portion (the other end portion) 142 which is a free end. The needle body portion 144 extends leftward from the pedestal 132 approximately in parallel to the base plate 136.

Each second contact 139 includes a needle body portion 145 having a rear end portion (one end portion) 141 supported on the pedestal 132 and a front end portion (the other end portion) 143 which is a free end. The needle body portion 145 extends rightward from the pedestal 132 approximately in parallel to the base plate 136.

The pedestal 132 is disposed approximately at the central portion of the first contact 138 and the second contact 139. Therefore, the length of each needle body portion 144 and the length of each needle body portion 145 are equal.

Accordingly, as illustrated, each first contact 138 is cantilevered at the rear end portion 140 so as to be positioned left side from the pedestal 132. Each second contact 139 is cantilevered at the rear end portion 114 so as to be positioned on the right side from the pedestal 132.

The front end portion 142 of each needle body portion 144 includes a tip portion 148 having a tip at its front end. Each needle body portion 145 includes a tip portion 149 having a tip 147 at its front end. The rear end of each needle body portion 145 is integrally connected to the rear end of the needle body portion 149.

Not shown in the drawings, but there are electrode pads of the electronic device vertically below the tips 146. When a test of passing electricity through the electronic device is conducted, the electronic device rises vertically by a moving apparatus (not shown), and the electrode pads contact the tips 146 in a state where each first contact 138 is warped upward (an overdrive state). At this time, each tip 146 scrapes off the oxide film on the surface of each electrode of the electronic device, thereby establishing an electrical contact between each tip 146 and each electrode. On the other hand, each second contact 139 is held at a height not to contact the electronic device.

When an electrical contact is established between each tip 146 and each electrode, an electrical signal inputted to the electrical connecting apparatus 130 through the tip 146 is fed to a tester (not shown) connected to the electrical connecting apparatus 130 to test electrical properties. The tips 146 and the tips 147 have an identical configuration.

The base plate 136 includes an FPC (flexible print circuit) (not shown), and the contacts 138, 139 are connected to the FPC through the wiring within the corresponding common pedestal 132. Each pedestal 132 is, for example, made of an insulating material and is arranged so as to contact both contacts 138, 139. Incidentally, if the pedestal is made of a metal material, the contacts 138, 139 and the pedestal 132 may be made integrally. And the pedestal 132 acts as what is called the connecting portion.

The base plate 136 includes on the underside 134 a plurality of stoppers 150 each having a configuration to conform to the upside configuration of the first or second contacts 138, 139. Each stopper 150 is made of an electrically insulating material.

When testing the electronic device, each tip 146 contacting the electrode of the electronic device pushes up each contact 138, but the stopper 150 prevents the contact 138 in a state of being warped upward (in an overdrive state) from contacting the underside 134 of the base plate 136 (FIG. 7(B)).

Incidentally, though not shown, as the electrode of the electronic device used in this embodiment, any of the electrodes used in the embodiments 1-4 above can be employed.

In the electrical connecting apparatus 130 as well, as explained in FIG. 3(A)-(C), a change (exchanging work of contacts) from a state of using the first contacts 138 to a state of using the second contacts 139 is made.

In the above embodiments, the first and second contacts are electrically connected to each other by a common connecting portion (pedestal), but the first and the second contacts may be supported by one and the other of the two electrically connected connecting portions.

In the above embodiments, needle-type contacts were used, but the described subject matter can be applied to an electrical connecting apparatus using plate-like contacts as described in WO2004/102207 and to an electrical connecting apparatus using the same as well.

In the above embodiments, the base plate may be either a wiring board or a probe base plate arranged on the underside of the wiring board as described in WO2004/102207.

In the above embodiments, the first contact and the second contact are connected to each other at each rear end portion, but if they are electrically connected through, for example, a pedestal, it is not necessary to connect the first contact and the second contact directly to each other.

Also, though the first contact and the second contact were linearly connected at each rear end portion, it is possible to connect the one to the other in an overlapped state.

In the above embodiments, the pedestal has a rectangular solid shape, but it is possible to provide an inclination or a difference in level in a contact plane of the pedestal and the base plate or the first contact and the second contact, to make the heights of respective tips of the first contact and the second contact from the electronic device mutually different.

Thus, for instance, if the tip of the second contact is set at a higher position than the tip of the first contact, the tip of the second contact not used does not contact another electrode pad or the electronic device or the like, thereby preventing malfunction of the electrical connecting apparatus.

In particular, because of necessity to use the contacts in an overdrive state, when the height (thickness) of the electrode pad is small, it is especially desirable to set the tip of the second contact at a higher position than the tip of the first contact.

In the above embodiments, when in use, the second contacts as well as the first contacts are also brought into contact with the electrode pads in a state of being warped upward (overdrive state), and each tip scrapes off the oxide film on the surface of each pad electrode, thereby establishing an electrical contact between each tip and each pad electrode.

In the above embodiments, when the second contacts are used, in order to prevent the tips of the first contacts from mistakenly contacting the electrode pads in the vicinity, it is enough to break the first contacts so as to remove at least the tip of each first contact.

The described subject matter is not restricted to the above embodiments but can be altered in various ways without departing from its spirit.

The invention claimed is:

1. An electrical connecting apparatus comprising:
   a base plate having an underside and provided with a plurality of connecting portions arranged on said underside at intervals in a front-back direction; and
   multiple contact groups, each having a pair of contacts;
   wherein each contact includes a needle body portion having one end portion supported on said connecting portion and the other end portion which is a free end and extending in a right-left direction;
   wherein the needle body portion of one of contacts in each contact group extends from said connecting portion toward one side in the right-left direction, while the needle body portion of the other contact in each contact group extends from said connecting portion toward the other side in the right-left direction; and
   wherein, when one contact of the pair of contacts in each contact group is in use to contact an electronic device, the other contact of the pair of contacts in each contact group is out of use and does not contact the electronic device.

2. The electrical connecting apparatus claimed in claim 1, wherein said one contact and said other contact are integrally formed.

3. The electrical connecting apparatus claimed in claim 1, wherein the needle body portion of said one contact and the needle body portion of said other contact are supported at a common connecting portion.

4. The electrical connecting apparatus claimed in claim 1, wherein the needle body portion of said one contact is longer than the needle body portion of said other contact.

5. The electrical connecting apparatus claimed in claim 1, wherein each contact is made of a flexible electrically conducting material.

6. The electrical connecting apparatus claimed in claim 1, further comprising a plurality of stoppers, wherein each stopper is located above one of the contacts and below the underside of said base plate, each stopper having an underside conforming to the upside of each contact.

7. The electrical connecting apparatus claimed in claim 1, wherein each contact is further provided with a tip portion directed downward from the other end portion.

8. The electrical connecting apparatus claimed in claim 7, wherein said tip portion includes a tip at its lower end and said tip of the one contact is positioned lower than the tip of the other contact.

9. A contact to be used for an electrical connecting apparatus, comprising a needle body portion having a first end portion, a second end portion opposite the first end portion, a first tip portion extending downward in the vertical direction from the first end portion, and a second tip portion extending downward in the vertical direction from the second end portion, wherein the first tip portion and the second tip portion are electrically connected to each other by a common connecting portion to provide redundant electrical connectivity, and wherein, when the first tip portion is in use to contact an electronic device, the second tip portion is out of use and does not contact the electronic device.

10. An electrical connecting apparatus comprising:
    a base plate having an underside and provided with a plurality of connecting portions arranged on said underside at intervals in a front-back direction;
    multiple contact groups, each having a pair of contacts; and
    a plurality of stoppers, wherein each stopper is located above one of the contacts and below the underside of said base plate, each stopper having an underside conforming to the upside of each contact;
    wherein each contact includes a needle body portion having one end portion supported on said connecting portion and the other end portion which is a free end and extending in a right-left direction; and
    wherein the needle body portion of one of contacts in each contact group extends from said connecting portion toward one side in the right-left direction, while the needle body portion of the other contact in each contact group extends from said connecting portion toward the other side in the right-left direction.

* * * * *